United States Patent
Babu et al.

[11] Patent Number: 5,840,427
[45] Date of Patent: Nov. 24, 1998

[54] METHOD FOR MAKING CORROSION RESISTANT ELECTRICAL COMPONENTS

[75] Inventors: Suryadevara V. Babu; Cancheepuram V. Srividya, both of Potsdam, N.Y.

[73] Assignee: Teledyne Industries Incorporated, Los Angeles, Calif.

[21] Appl. No.: 650,987

[22] Filed: May 21, 1996

[51] Int. Cl.⁶ .............................................. H01L 31/0312
[52] U.S. Cl. ........................ 428/408; 257/77; 428/457; 428/446
[58] Field of Search .............................. 257/47; 428/408, 428/446, 457

[56] References Cited

U.S. PATENT DOCUMENTS

| | | |
|---|---|---|
| 4,985,227 | 1/1991 | Ito et al. . |
| 5,258,206 | 11/1993 | Hayashi et al. . |
| 5,270,028 | 12/1993 | Tanabe et al. . |
| 5,423,475 | 6/1995 | Burke . |
| 5,431,963 | 7/1995 | Rzad et al. . |
| 5,438,222 | 8/1995 | Yamazaki ................................. 257/673 |
| 5,458,927 | 10/1995 | Malaczynski et al. . |
| 5,470,661 | 11/1995 | Bailey et al. . |
| 5,474,816 | 12/1995 | Falabella . |
| 5,506,446 | 4/1996 | Hoffman et al. ......................... 257/674 |
| 5,559,367 | 9/1996 | Cohen et al. ............................... 257/77 |
| 5,612,228 | 3/1997 | Shie et al. ................................... 257/40 |

OTHER PUBLICATIONS

Plasma Deposition and Etching of Diamond–Like Carbon Films, Reprinted from AICHE Journal, Mar. 1991 vol. 37, No. 3, pp. 367–376.

*Primary Examiner*—A. A. Turner
*Attorney, Agent, or Firm*—Bond, Schoeneck & King, LLP; Stephen B. Salai

[57] ABSTRACT

A method is described for forming a corrosion resistant electrical component comprising exposing an electrical component to a first atmosphere containing silicon ions to coat the electrical component with a polysilicon film; and exposing the polysilicon coated component to a second atmosphere containing carbon ions generated from a gaseous mixture comprising a carbon source gas to encapsulate the polysilicon coated electrical component with a diamond-like carbon coating, the carbon source gas having a carbon to hydrogen atom ratio of between about 1:1 and 1:2.

20 Claims, 7 Drawing Sheets

METHOD FOR MAKING CORROSION RESISTANT ELECTRICAL COMPONENTS

FIELD OF THE INVENTION

This invention relates generally to method of making corrosion resistant electrical components, and in particular, to encapsulating a substrate for an electrical component with a diamond-like carbon (DLC) coating by deposition of carbon ions from a gaseous mixture containing a carbon source gas. It also relates to electrical components made by this method.

BACKGROUND OF THE INVENTION

Diamond-like carbon (DLC) films have found use in a variety of applications due to their wide spectrum of highly desirable properties like hardness, extreme chemical inertness, very high electrical resistivity, smoothness, very low moisture diffusivity, etc. Many of these properties can be varied over a wide range of values by changing the deposition process parameters. DLC films can be deposited using various techniques such as ion beam sputtering, glow discharge deposition, chemical vapor deposition (CVD), plasma-assisted CVD, laser ablation, etc.

Hard DLC films are composed mostly of carbon and small amounts of hydrogen, the latter both in bonded and unbonded forms. The structure and properties of these amorphous carbon films depend on the nature of the carbon-carbon and carbon-hydrogen bonding in the film. Three possible bonding configurations—$sp^3$, $sp^2$ and sp—exist. The $sp^2$ C—C structures are predominantly graphitic while $sp^3$ C—C structures have diamond-like characteristics. Hard DLC films have a significant amount of $sp^3$ carbon-carbon bonds compared to softer, more polymer like, films. These $sp^3$ carbon-carbon structures are responsible for the diamond-like properties of the DLC films.

U.S. Pat. No. 5,431,963 to Rzad et al. discloses a method for the plasma enhanced chemical vapor deposition of two layers of diamond-like carbon film onto a smooth metal substrate by plasma enhanced chemical vapor deposition. A relatively high power first deposition step of 250 Watts is used to improve adhesion of the DLC film to the metal substrate. A second low power (60 Watts) deposition step forms a second DLC layer adhered to the first DLC layer. Field graded electrodes with improved breakdown voltages are obtained.

U.S. Pat. No. 5,258,206 to Hayashi et al. discloses a method for the plasma enhanced deposition of a diamond-like carbon thin film of uniform thickness and excellent adhesion on a protruding substrate using an adjacent auxiliary member. A high substrate temperature of from 300° to 1500° C. is needed to obtain good adhesion of the DLC film.

U.S. Pat. No. 5,458,927 to Malaczynski et al. discloses a process for forming an adherent diamond-like carbon coating on a workpiece of suitable material such as an aluminum alloy to provide a hard, scuff resistant coating. The workpiece is successively immersed in different plasma atmospheres and subjected to short duration, high voltage, negative electrical potential pulses or constant negative electrical potentials to clear the surface of oxygen atoms and implant carbon atoms into the surface of the alloy to prepare the surface for adhering the DLC film.

U.S. Pat. No. 5,474,816 to Falabella discloses a method of coating a substrate with amorphous diamond comprising cooling the substrate to room temperature or below; biasing the substrate at a voltage of between about −70 and −225 volts to increase the incident carbon ion energy and condensing carbon ions from an ionized beam of carbon generated by a cathodic arc source onto the substrate to coat the substrate with a film of substantially hydrogen free amorphous diamond having an intrinsic stress of substantially below 6 GPa. The high energy impact of the carbon ions improves adhesion.

U.S. Pat. No. 5,470,661 to Bailey et al. discloses an improved method of depositing a diamond-like carbon film onto a substrate by low temperature (200°–300° C.) plasma enhanced chemical vapor deposition from a hydrocarbon /helium plasma. Such coatings are more thermally stable.

U.S. Pat. No. 4,985,227 to Ito et al. discloses a method for synthesizing diamond by contacting a gas obtained by the microwave irradiation in a plasma generator of a carbon source gas and hydrogen mixture at substrate temperatures greater than 400° C.

U.S. Pat. No. 5,270,028 to Tanabe et al. discloses an improved CVD method for producing a diamond at a high rate. More particularly, the Tanabe patent relates to a method for producing a high quality diamond or covering a substrate with the high quality diamond by generating a low temperature plasma from a mixture of hydrogen, an inert gas and a carbon source gas with one of a direct current and an alternating current electromagnetic field and at a pressure of from 5 Torr to 760 Torr. The substrate temperature is from 700° C. to 1200° C.

None of the cited patents disclose a method for increasing the corrosion resistance of an electrical component by encapsulating the component with a diamond-like carbon film.

DLC film properties are greatly affected by the proportion of $sp^3/sp^2$ carbon-carbon and carbon-hydrogen bonding and the hydrogen content of the films. These, in turn, are influenced by process variables such as gas composition, ion impact energy, which is a function of deposition pressure and substrate bias voltage, and feed gas flow rate etc. Mechanical flaws in the form of pinholes, residual stresses, etc., in any film are detrimental to its usefulness as a protective coating. Stress, in most cases, accelerates corrosion, with the acceleration rate depending on the corrosive environment to which the test sample is exposed.

It is an object of this invention to provide a method for forming a corrosion resistant electrical component.

It is an object of this invention to provide a method for encapsulating an electrical component with a DLC coating having a desired level of diamond-like properties by deposition from selected carbon source gases.

SUMMARY OF THE INVENTION

Briefly the invention relates to a method for forming a corrosion resistant electrical component comprising exposing an electrical component to a first atmosphere containing silicon ions to coat the electrical component with a polysilicon film; and exposing the polysilicon coated electrical component to a second atmosphere containing carbon ions generated from a gaseous mixture comprising a carbon source gas to encapsulate the polysilicon coated electrical component with a diamond-like carbon coating, the carbon source gas having a carbon to hydrogen atom ratio of between about 1:1 and 1:2.

In another aspect of the invention there is provided a corrosion resistant electrical component comprising an electrical component; a polysilicon coating on the electrical component; and a diamond-like carbon coating encapsulating the polysilicon coated electrical component, the carbon coating formed by exposing the polysilicon coated electrical component to an atmosphere containing carbon ions, the carbon ions generated from a gaseous mixture comprising a carbon source gas, the carbon source gas having a carbon to hydrogen atom ratio of between about 1:1 and 1:2.

The novel aspects of this invention are set forth with particularity in the appended claims. The invention itself, together with further objects and advantages thereof may be more fully comprehended by reference to the following detailed description of a presently preferred embodiment of the invention taken in conjunction with the accompanying drawings.

DETAILED DESCRIPTION OF THE INVENTION

Figure 1:
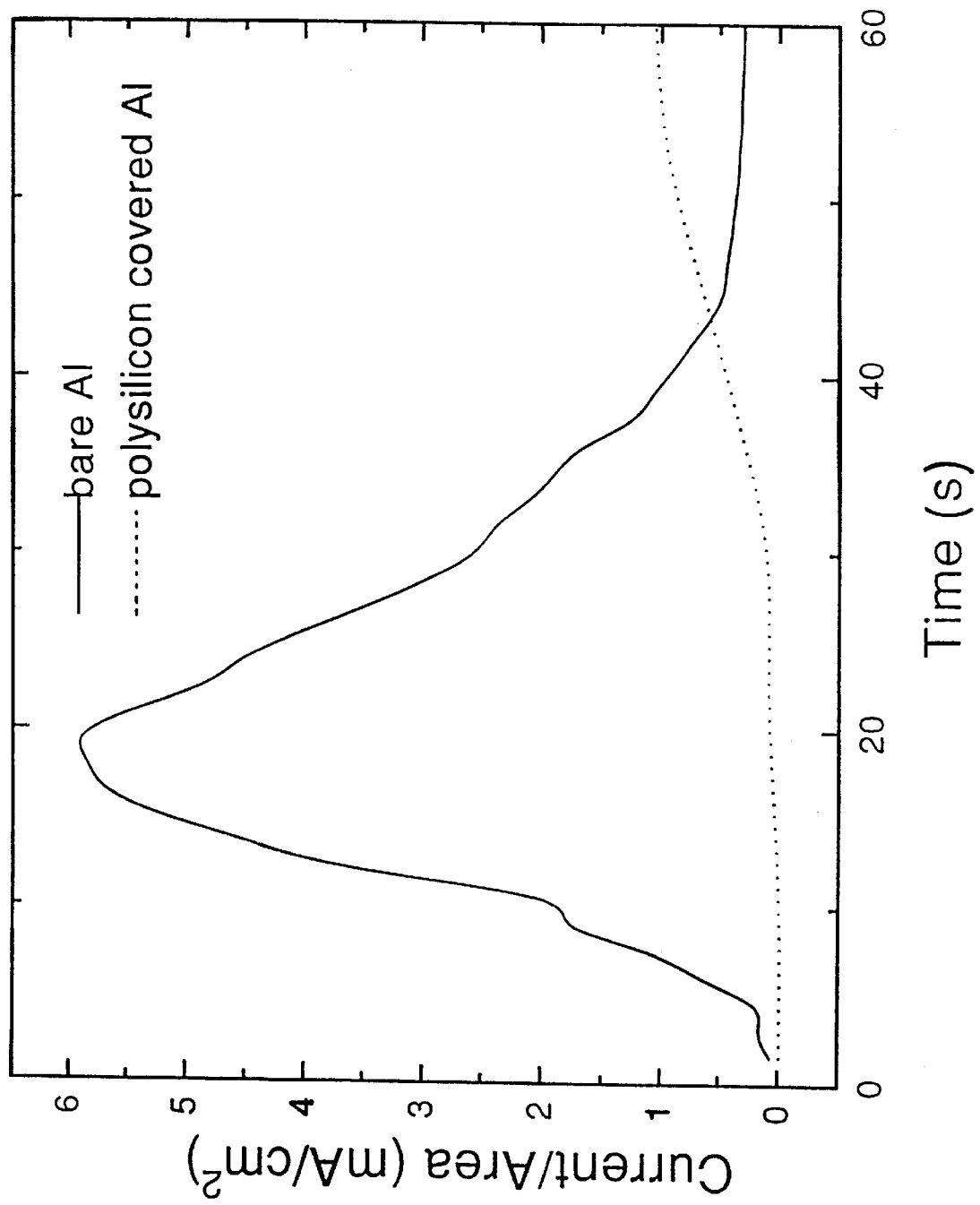
FIG. 1 illustrates the corrosion current density recorded with bare aluminum film; and polysilicon (PS) covered aluminum film.

The present invention provides a method for encapsulating an electrical component with a diamond-like carbon film to prevent corrosion of the various elements of the component. Suitable materials for electrical components which may be encapsulated with the DLC coating of the invention include organic and inorganic substances such as, for example, metals, ceramics, glass and plastics. The electrical component may be an individual component of a multi-component device or the entire device, for example, electronic chip boards, electronic circuit boards, semiconductor devices and the like. The DLC coating can be applied to individual components of the board or can be applied over the entire board. The component to be coated may be any shape or size provided that it can be placed into a suitable reaction chamber.

By the term "encapsulate" and derivatives thereof, as used herein, it is meant that all exposed surfaces of a device and/or it's component parts are coated with the relevant film.

There is no particular restriction on the means for exciting the carbon source gas provided it can form DLC films by means of a vapor phase deposition method. A preferred method for depositing the DLC film is by radio frequency powered plasma decomposition of a carbon source gas. The method of the invention is described for a preferred embodiment in the form of a metal substrate for an electrical component.

DLC films are deposited on a metal substrate in a conventional parallel-plate plasma reactor (Plasma Therm model 730). The substrate is placed on the lower powered electrode, maintained nominally at room temperature by circulating a coolant mixture. The process gases, a carbon source gas and a diluent gas enter the chamber through a shower head in the upper grounded electrode. The unreacted gases are removed by a blower-mechanical pump combination through exhaust ports located at the four corners in the lower wall of the reaction chamber.

Suitable metal substrates include those which can bond with carbon and/or silicon, for example, aluminum, silver and gold.

During DLC film deposition, four process parameters, namely, a) carbon source gas, b) diluent (preferably $H_2$ or an inert gas) used in the feed gas mixture, c) feed gas flow rate, and d) rf power, are varied. The deposited films are analyzed for corrosion resistance by measuring the corrosion current densities as described below.

The metal substrate may be optimally coated with an intermediate layer prior to coating the substrate with a diamond-like carbon coating to improve adhesion of the DLC. Such intermediate coatings include, for example, polysilicon and gold. DLC films can be obtained from carbon source gases which include any gas containing at least carbon atoms and hydrogen atoms, for example, saturated and unsaturated hydrocarbons, oxygen containing hydrocarbons and nitrogen containing hydrocarbons. However, carbon source gases containing a low ratio of carbon to hydrogen, for example methane (C:H ratio of 1:4) produce coatings which have less diamond-like characteristics. Such coatings are softer, have intrinsic stress and are not as suitable as corrosion protective coatings.

Suitable carbon source gases include hydrocarbon gases containing carbon atoms and hydrogen atoms in a favorable ratio of between about 1:1 and 1:2. Such a ratio of carbon and hydrogen atoms produces DLC films with sufficient $sp^3$ character and hydrogen content to provide hard coatings with low intrinsic stress and are suitable as corrosion protective coatings.

Hydrocarbon gases with a C:H ratio of between 1:1 and 1:2 which may be mentioned include C2–C4 alkenes such as ethylene, propylene, butylene and 1,3 butadiene, alkynes such as acetylene and 1-propyne, C3–C6 cycloalkanes such as cyclopropane and cyclohexane and aromatic hydrocarbons such as benzene, styrene, toluene and xylene.

Suitable diluent gases include hydrogen and the inert gases such as helium and argon. An inert gas is preferred since it is not a source of hydrogen and hence cannot increase the hydrogen content of the DLC film. The carbon source gas is mixed with the diluent gas so that the final concentration of the carbon source gas is from about 10% to 80% (v/v) preferably about 20% (v/v).

The corrosion characteristics of DLC films deposited using methane ($CH_4$), acetylene ($C_2H_2$), and 1,3-butadiene ($C_4H_6$) as carbon source gases and argon and hydrogen as diluents were compared for different process conditions: feed gas flow rate and composition, and rf power. The effect of post-deposition annealing on film corrosion resistance was also studied. The substrates used were aluminum film-covered single crystal silicon substrates. The results are compared with those for spin-coated polyimide films on similar substrates. Polyimide coatings are currently being used for the encapsulation of metal contacts. Certain DLC films offer much superior corrosion resistance.

EXAMPLES

The experiments consisted of (i) deposition of Al on single crystal silicon substrates by thermal evaporation, (ii)

deposition of DLC films or spin coating of PI films on Al/Si substrates, and (iii) measurement of corrosion current for each of the composite films by potentiostatic methods. A 5 nm thick layer of rf plasma-deposited polysilicon (PS), from a mixture of silane and argon, was used between the Al and DLC films to improve adhesion, resulting in DLC/PS/Al/Si substrates.

0.1 $\mu$m thick aluminum films were deposited on single-crystal silicon substrates by thermal evaporation from aluminum pellets in a vacuum chamber which was pumped down to a pressure of $10^{-5}$ Torr using a turbomolecular pump. A 5 nm thick layer of rf plasma-deposited polysilicon (PS), from a mixture of silane and argon, was deposited on the aluminum film. DLC films were deposited on the PS/aluminum film-covered silicon substrates in a conventional parallel-plate plasma reactor (PlasmaTherm model 730). The substrates were placed on the lower powered electrode, maintained nominally at room temperature by circulating a coolant mixture, such as ethylene glycol/water. The surface of the substrate under the deposition conditions is thus kept at less than about 60° C. The process gases, methane, acetylene or butadiene along with the appropriate diluents, for example, argon (Ar) or hydrogen ($H_2$), as the case may be enter the chamber through a shower head in the upper grounded electrode. The unreacted gases were removed by a blower-mechanical pump combination through exhaust ports located at the four corners in the lower wall of the reaction chamber. The base pressure in the chamber is about 25 mTorr. Rf power at 13.56 MHz is delivered by a 600 Watt generator to the chamber through an automatic matching network. Deposition under such conditions for 5–10 minutes provides a DLC film of between about 0.1 and 0.3 microns. A film thickness of about 0.2 microns is preferred. Such a thickness of the film exhibits minimal stress and has excellent corrosion resistance.

Polyimide films (PI) were deposited by spin coating on aluminum covered single crystal silicon substrates. The polyimide used was DuPont PI 2613 LX. The spin speed was ramped up to 3000 RPM at an acceleration of 60000 Rev/(Min) . The duration of spin was 40 s. The PI film thickness was typically around 300 nm. After spin coating, the PI films were cured by soft-baking at 90° C. for 2 min and 130° C. for 20 min. followed by a hard-bake at 350° C for one and a half hours.

The deposition conditions and the feed gas mixtures used in the preparation of the DLC film samples investigated are given in Table I.

The corrosion resistance offered by DLC/PS films to the underlying aluminum films was quantitatively estimated by potentiostatic measurements. A Standard Calomel Electrode (SCE) and a platinum electrode were used as the reference and counter electrodes, respectively. The electrolytic solution consisted of 0.1 M NaCl and 0.1 M $Na_2SO_4$ in deionized water. A controlled voltage was applied to the test sample immersed in the electrolytic solution and the resulting corrosion current was measured as a function of time. An EG&G potentiostat-galvanostat voltage applied to the test sample was determined from the polarization curves determined using bare aluminum films on silicon substrates.

The dynamic measurements were made by sweeping the potential applied to the test sample at the rate of 5 mV/s in the range –1.5 V to +1.5 V (SCE) and measuring the resulting corrosion current as a function of the applied potential. The pitting potential, i.e., the potential above which corrosion of the anode (the test sample) occurs in the electrolytic solution, was found to be –0.8V with respect to the SCE. Hence, a controlled voltage of 0.0 V (SCE) was applied to the test sample during the subsequent potentiostatic measurements. While this was well below the potential at which the solvent breakdown occurs, it still ensured a zero induction time for the corrosion of the test sample.

The dimensions of the test samples were typically 25 mm×25 mm. The sample edges were covered with polyimide tape to protect them from the attack of the surrounding electrolytic solution. A three-compartment glass cell was used to hold the sample and the electrodes. It was filled with the electrolytic solution and the test sample was placed in the central compartment. The reference electrode and the counter electrode were placed in the other two compartments separated from the central one by coarse sintered glass. The sample served as the working electrode. All the three electrodes were connected to the potentiostat and a potential of 0.0 V (SCE) was applied to the working electrode (sample) and the current resulting from aluminum dissolution was recorded as a function of time.

FIG. 1 shows the corrosion currents registered by bare aluminum and polysilicon-covered aluminum films on single crystal silicon substrates. The bare aluminum film starts dissolving right away. The current reaches its peak value in about 20 s and then starts falling till it reaches zero around 45 s. At this point the Al film had almost completely dissolved in the electrolytic solution. Both the peak current (6 mA/$cm^2$) and the time it takes to reach this value (20 s) are representative of the extent of corrosion occurring in the

TABLE I

Process conditions for DLC film deposition; the deposition pressure was kept at 25 mTorr for all the samples.

| Sample No. | Precursor gas | Diluent | Feed gas composition (Precursor/diluent) | Total flow rate (sccm) | rf power (Watts) | bias voltage (volts) |
|---|---|---|---|---|---|---|
| 1 | 1,3 butadiene | argon | 1/4 | 120 | 150 | 285 |
| 2 | acetylene | argon | 1/4 | 120 | 150 | 285 |
| 4 | methane | argon | 1/4 | 120 | 150 | 275 |
| 4 | 1,3 butadiene | hydrogen | 1/4 | 120 | 150 | 295 |
| 5 | 1,3 butadiene | hydrogen | 1/9 | 120 | 150 | 290 |
| 6 | 1,3 butadiene | argon | 1/4 | 120 | 100 | 230 |
| 7 | 1,3 butadiene | argon | 1/4 | 50 | 150 | 280 |
| 8 | 1,3 butadine | argon | 1/4 | 50 | 100 | 240 | film. Similar values are given in FIG. 1 for 5 nm thick polysilicon (PS)-covered aluminum film. These values for the bare and PS-covered Al films serve as a reference for evaluating and comparing the potential of DLC and PI films in protecting the underlying aluminum film from corrosion. The corrosion current for PS/Al/Si sample shown in FIG. 1 (see also FIG. 6) is lower than that for the bare aluminum film.

Figure 2:
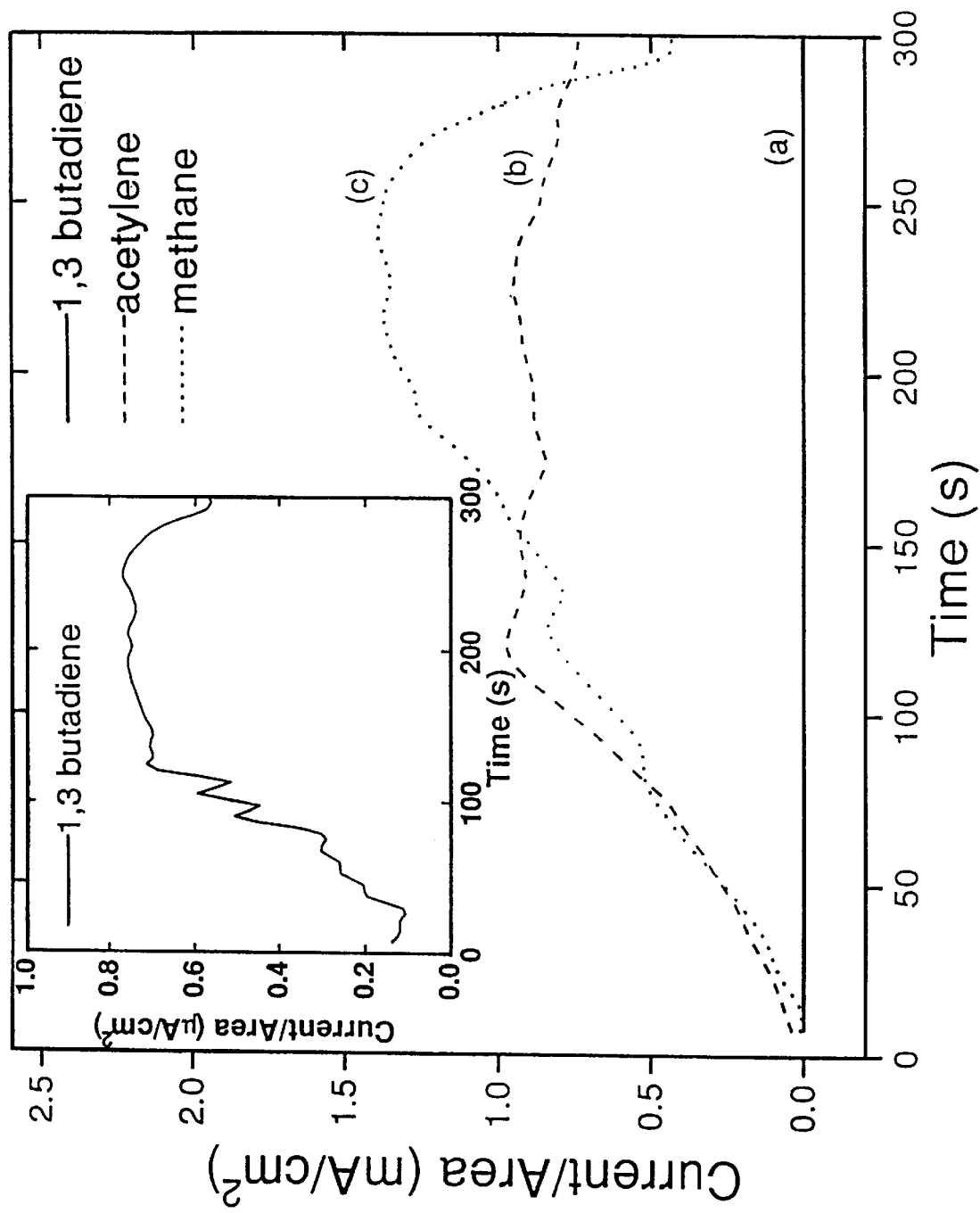
FIG. 2 illustrates the corrosion current densities for DLC/PS coated aluminum using different carbon source gases.

FIG. 2 compares the corrosion current densities measured with the DLC/PS/Al/Si structures of Samples 1, 2 and 3, prepared using three different carbon source gases—1,3 butadiene, acetylene, and methane. Argon (80%) was used as the diluent in all the three cases. As seen from FIG. 2, the films deposited from butadiene (Sample 1), offered the best protection while those deposited from methane (Sample 3) offered the least protection against corrosion, with the films prepared using acetylene (Sample 2) in the middle.

Figure 3:
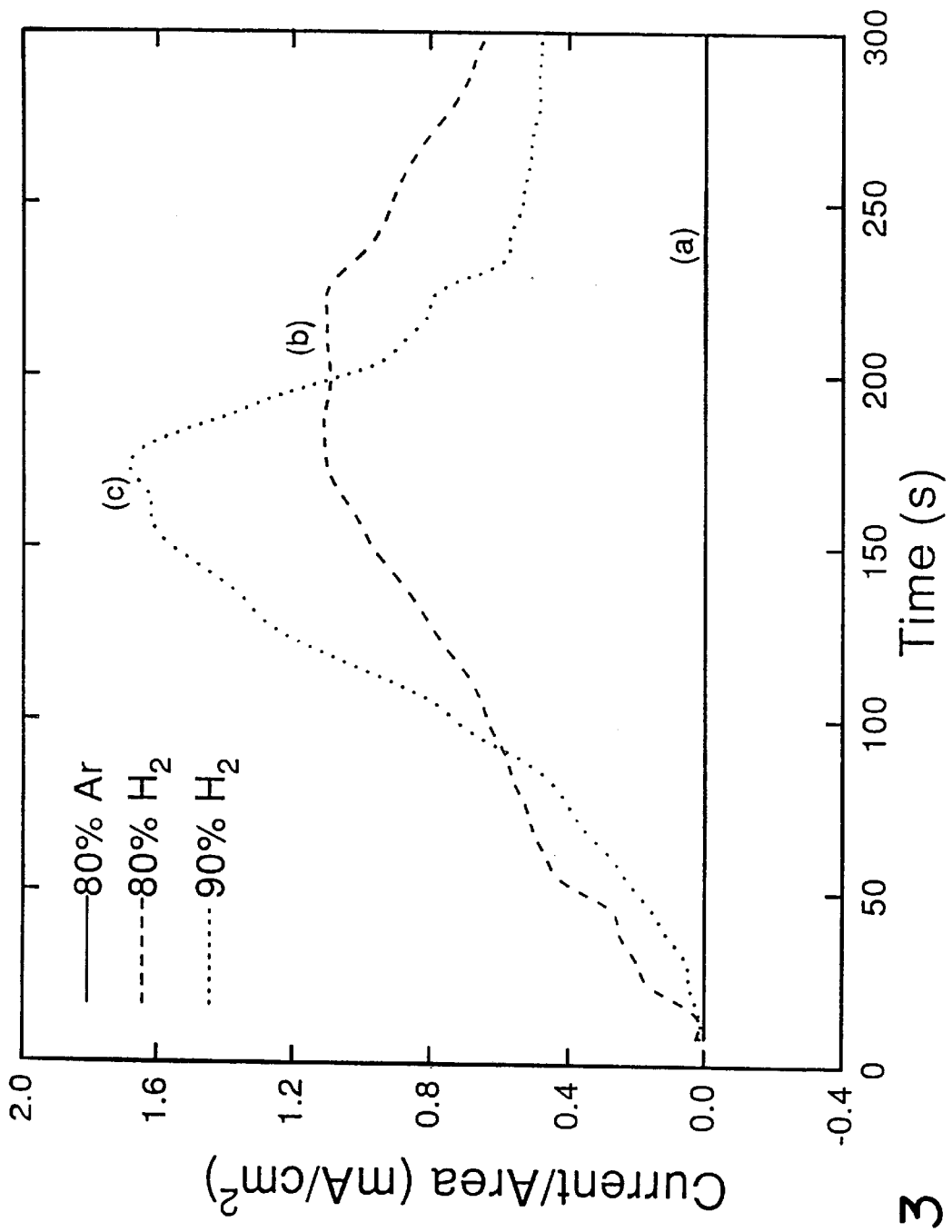
FIG. 3 illustrates the corrosion current densities for DLC/PS coated aluminum using different diluent gases.

FIG. 3 shows the corrosion current densities recorded with DLC/PS/Al/Si structures of Samples 1, 4 and 5, prepared from butadiene/Ar (Sample 1) and butadiene/$H_2$ (Samples 4 and 5) feed gas mixtures. The current density increases with an increase in the hydrogen content in the feed gas mixture. This is consistent with the corrosion behavior observed above with the DLC films deposited from the three different precursor gases.

Figure 4:
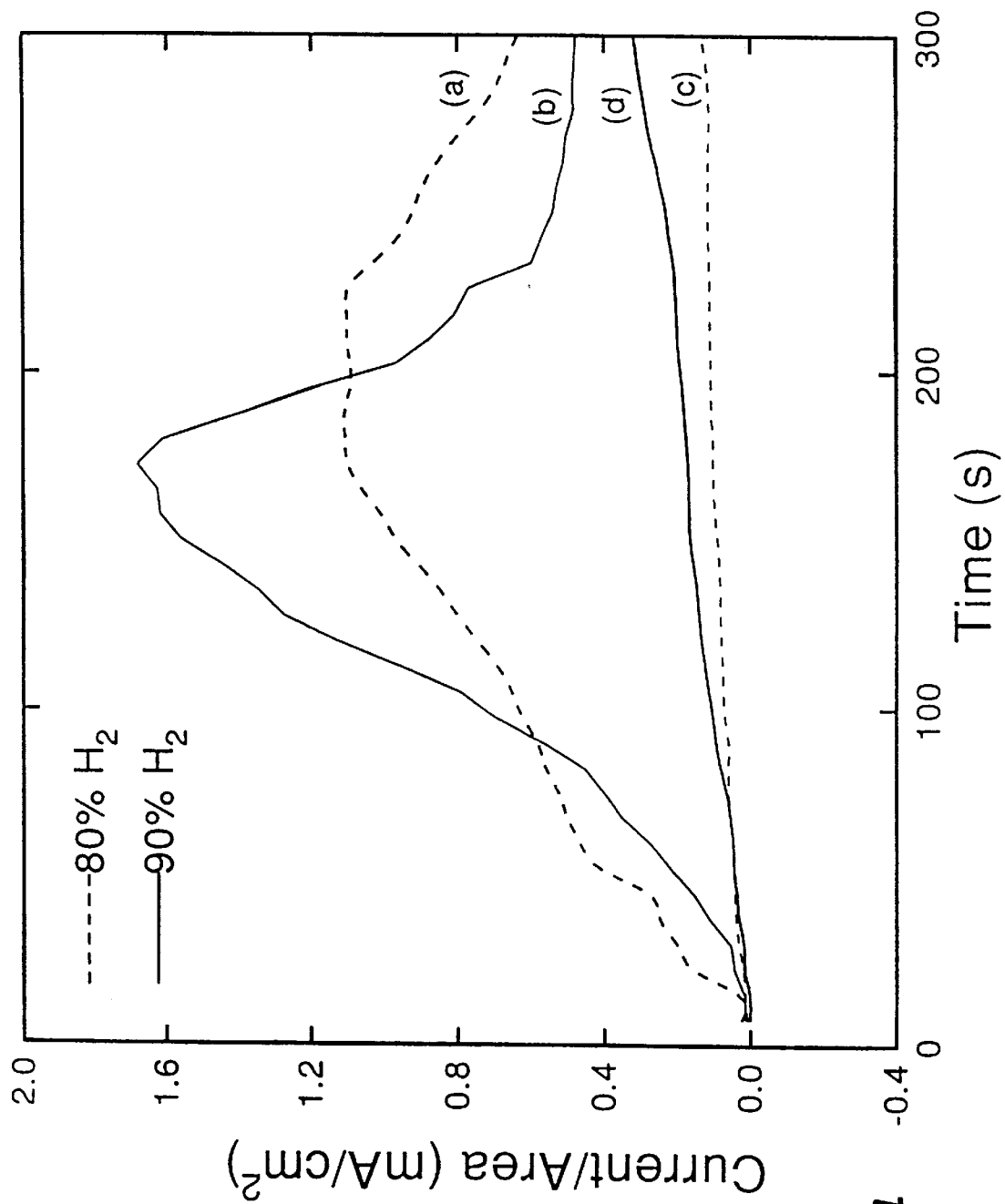
FIG. 4 illustrates the corrosion current densities for DLC/PS coated aluminum using different concentration of gases with and without annealing.

FIG. 4 shows the corrosion current densities recorded with DLC/PS/Al/Si structures of Samples 4 and 5, prepared from butadiene/$H_2$ feed gas mixtures with (Curves c and d) and without (Curves a and b) annealing in argon at 250° C. for an hour. Annealing improves the corrosion resistance of DLC films.

Although the inventor does not wish to be bound by any particular theory, it is most likely that the differences described above in the corrosion behavior of the DLC films deposited at various feed gas compositions are a result of the differences in the internal stresses in the deposited films.

Residual stresses in DLC films increase with an increase in the fraction of unbound hydrogen in the films. The fraction of unbound hydrogen in the deposited films depends on the H/C ratio in the precursor gas and the extent of dissociation of the precursor gas molecules in the plasma. Methane has the highest H/C ratio (4/1) and, hence, the fraction of unbound hydrogen and the associated stress are likely to be the highest in the DLC films deposited from methane. Though acetylene (1/1) has a lower H/C ratio than butadiene (1.5/1), the films deposited from butadiene are likely to have a lower fraction of unbound hydrogen because butadiene contains more bonds that need to be broken to release free hydrogen atoms. Hence, in the method of the invention, the residual stresses in the deposited films are likely to decrease as the carbon source gas is changed from methane to acetylene to 1,3-butadiene in that order. The fact that the corrosion current increased with the increase in the percentage of hydrogen diluent in the feed gas mixture further confirms this argument.

Film porosity strongly influences its corrosion resistance. Increasing the hydrogen content in the plasma discharge very likely results in an increase in the hydrogen content of the film, which decreases the film density, resulting in a more porous film. In contrast, argon addition to the feed gas mixture results in denser and less porous films as confirmed by the density values of 2.6 g/cc and 0.95 g/cc, respectively, measured for the films deposited from argon/butadiene (4/1) and hydrogen/butadiene (9/1) mixtures. Since annealing results in hydrogen evolution from the film and a reduction in residual stress and film porosity, the improved corrosion resistance of the annealed films also supports the argument that the presence of stress and porosity are detrimental to film corrosion resistance.

Figure 5:
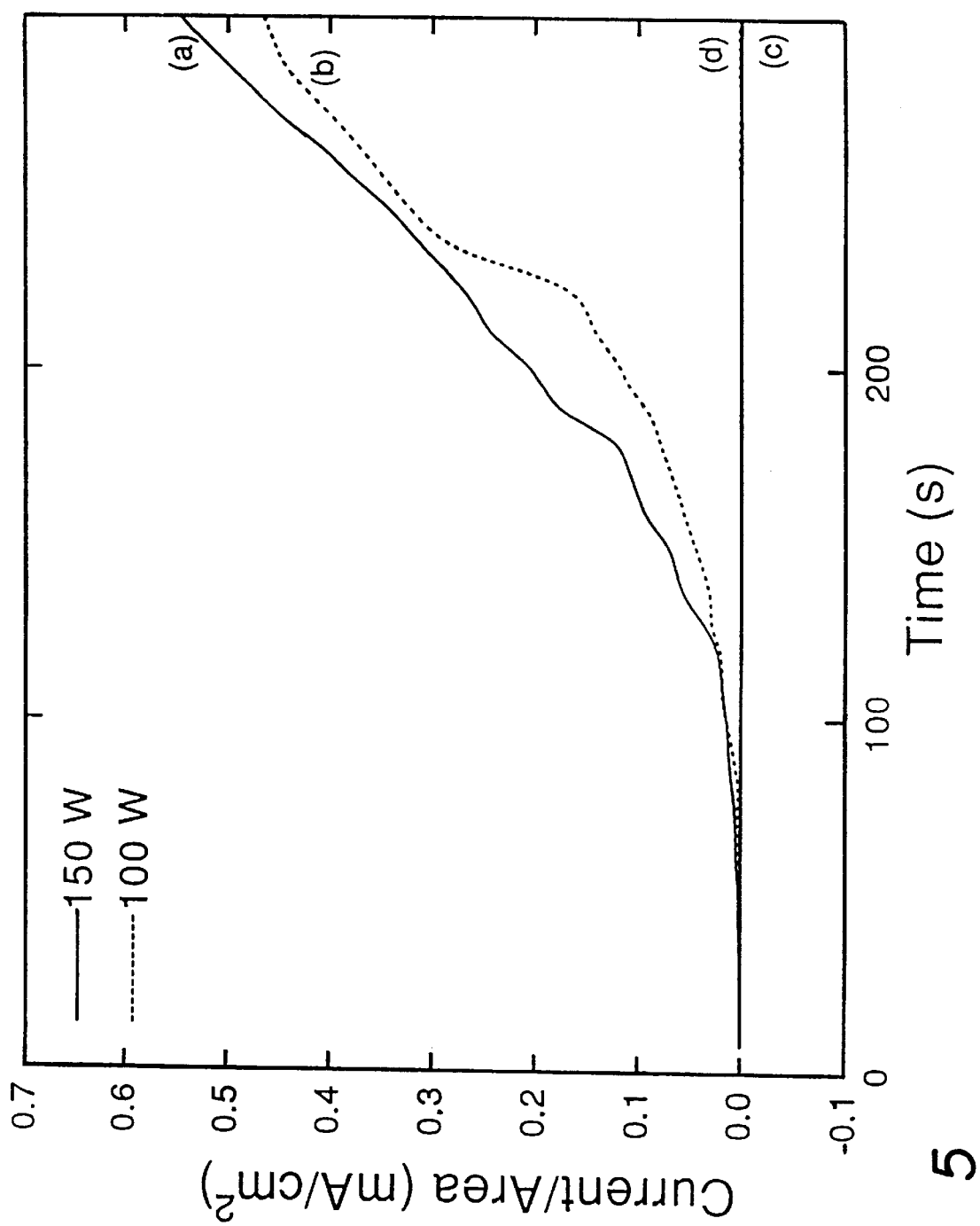
FIG. 5 illustrates the corrosion current densities for DLC/PS coated aluminum using different powers and gas flow rates.

FIG. 5 shows the corrosion current densities recorded with DLC/PS/Al/Si structures of Samples 1, 6 , 7 and 8 , for DLC films deposited at two different rf powers, 150 W and 100 W and different gas flow rates There is only a slight decrease in the corrosion current density as the rf power is lowered from 150 W (Curves a and c) to 100 W (Curves b and d) , with the associated bias voltage changing by only 50 V (see Table 1). Apparently, this change is not significant enough to alter the internal stresses in the deposited films. However, films deposited at 300 W failed before they could be tested for corrosion, suggesting excessive internal stresses. In contrast, difficulty in handling the very soft films that resulted at lower rf powers (<100 W) prevented their investigation also. The higher gas flow rate 120 sccm (Samples 1 and 6, Curves c and d respectively), reduces the corrosion current significantly from the lower gas flow rate 50 sccm (Samples 7 and 8, Curves a and b respectively).

Figure 6:
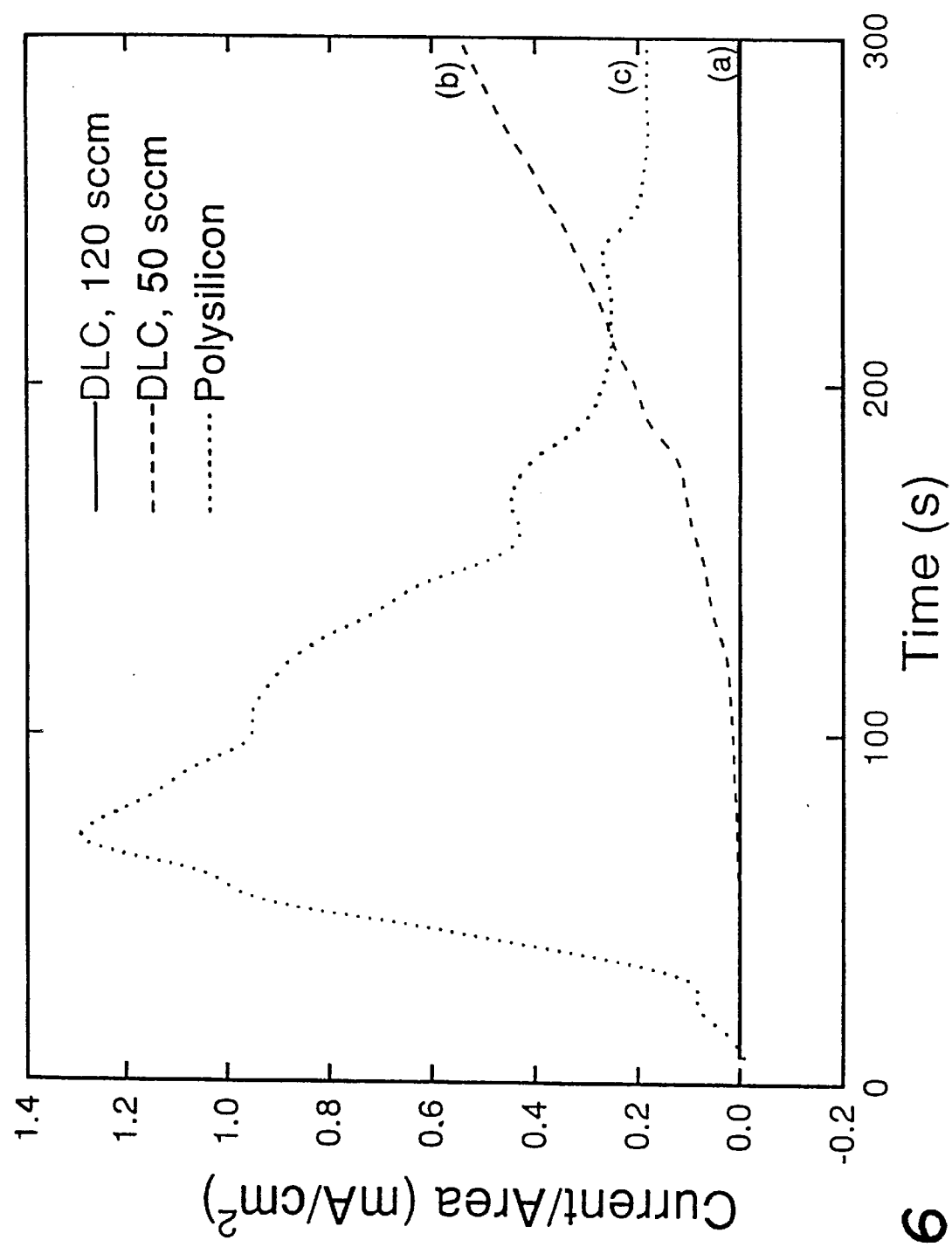
FIG. 6 illustrates the corrosion current densities for DLC/PS coated aluminum using different gas flow rates and (c) the polysilicon covered aluminum film of FIG. 1.

FIG. 6 shows the corrosion current densities recorded with DLC/PS/Al/Si structures of Samples 1 and 7, for DLC film deposition at different gas flow rates. The films deposited at a flow rate of 120 sccm (Sample 1) are significantly more corrosion resistant than those deposited at a flow rate of 50 sccm (Sample 7). Apparently, in view of the earlier observations, the gas flow rate has a strong influence on the residual stresses in the film. Indeed, this is confirmed by the observation that for longer deposition times, the films deposited at lower gas flow rates failed while those deposited at higher gas flow rates remained intact. The corrosion current for a polysilicon coated aluminum (PS/Al/Si) is also shown.

It is known that the properties such as optical bandgap, hydrogen content and $sp^3/sp^2$ ratio of a-C:H film, deposited from different process gases but at a common bias voltage of 400 V, are independent of the precursor gas. This is attributed to the almost complete fragmentation of the precursor gas molecules at high bias voltages. However, at lower bias voltages (<400 V), the choice of the precursor gas influences the film properties considerably. In the method of the invention all the films were deposited at 150/100 W rf power and the bias voltages, given in Table I, were in the range 290-240 V.

Corrosion resistance is found to be dependent on the precursor gas, with argon providing greater corrosion resistance than hydrogen.

Figure 7:
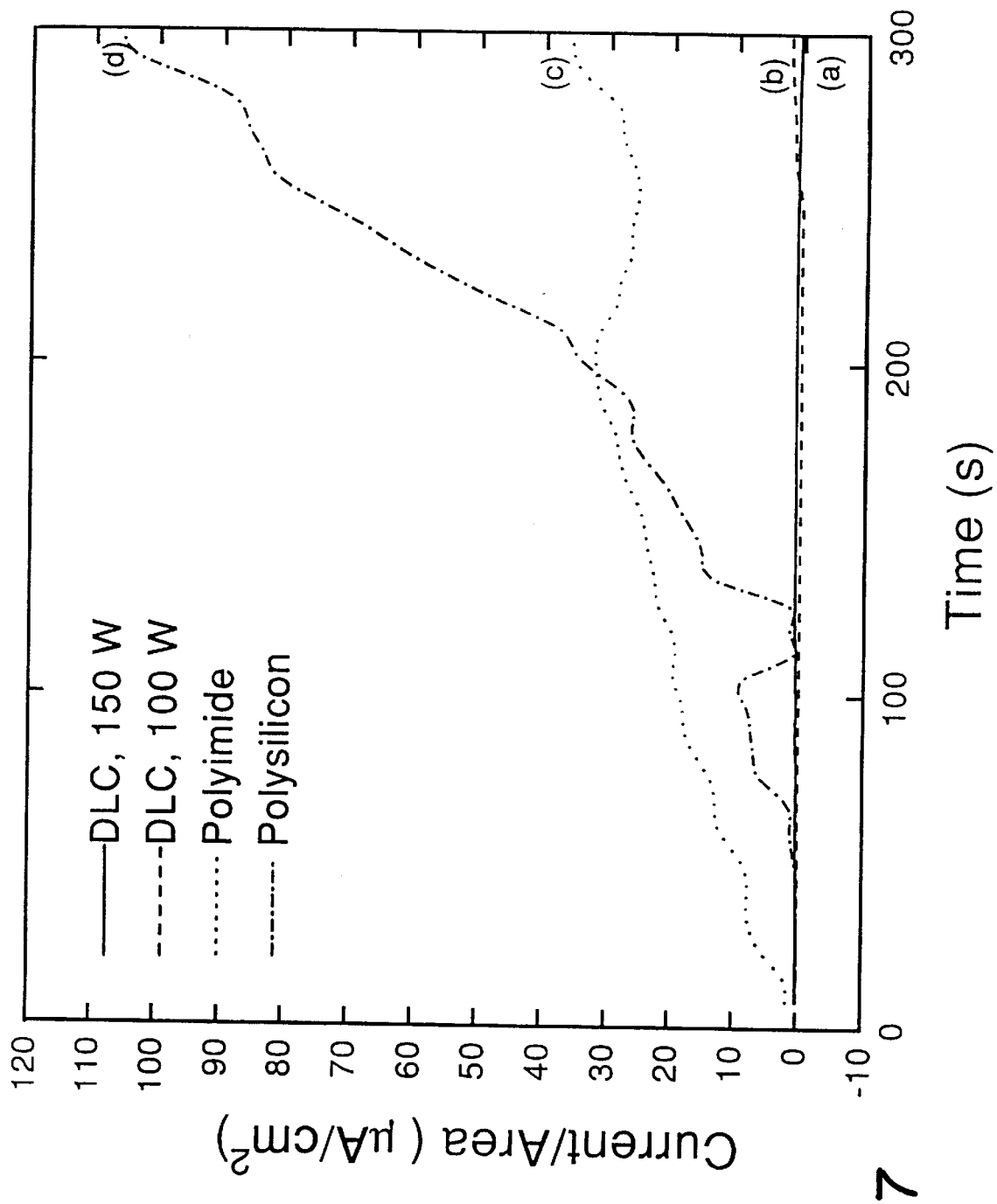
FIG. 7 illustrates the corrosion current densities for DLC/PS coated aluminum using different rf powers. Curves (c) and (d) represent the corrosion currents recorded with polyimide (PI) and polysilicon coated aluminum respectively.

FIG. 7 compares the corrosion currents measured with the DLC/PS/Al/Si structures of Samples 1 and 6 , prepared under two different DLC film deposition conditions, with that from a polyimide PI2613 PI/Al/Si sample. Comparing FIGS. 7 and 1, it can be seen that the corrosion current densities registered with both DLC and PI films are substantially smaller than those recorded with bare aluminum films. However, the corrosion current for the DLC/PS films, deposited at 120 sccm gas flow rate and 150/100 W rf power, is more than 15 times lower than that for the PI film.

FIGS. 1 and 6 suggest that while a PS film improves the corrosion resistance of the underlying Al layer, it is certainly not responsible for the dramatic improvements shown in FIGS. 2 through 7. Indeed, the 5 nm thick polysilicon layer reduces the corrosion current by at most a factor of five and stretches out the dissolution time to about 80 seconds. However, these values are nowhere close to the $\mu A/cm^2$ corrosion current and a dissolution time that exceeds 300 sec found for the DLC/PS-coated aluminum films (FIG. 2, Sample 1).

Other experimental data suggest that thicker PS films, for example, as shown in FIG. 7, a 180 nm thick layer will also improve the corrosion resistance of the underlying Al film but not to the extent of improvement provided by the DLC films of the invention.

DLC films reduced the corrosion rate of Al by up to almost three orders of magnitude. Each of the carbon source gases tried afforded films which offered some corrosion protection. However, films deposited from carbon source gases with a carbon:hydrogen ratio of greater than about 1:2, preferably about 1:1.5, were required to provide adequate corrosion protection. Films deposited at a higher gas flow rate of 120 sccm were much more corrosion resistant than those deposited at 50 sccm. Annealing improves greatly the protection offered by the films against corrosion by reducing film stresses and porosity.

Finally, the DLC films deposited using butadiene/argon (1:4) feed gas mixture at 120 sccm gas flow rate and 100/150 W rf power generated corrosion currents that are more than 15 times smaller than those for PI (PI2613) films. Such DLC films have better corrosion resistance and mechanical properties which are advantageous for encapsulation of electrical components.

While the invention has been described in connection with a presently preferred embodiment thereof, those skilled in the art will recognize that many modifications and changes may be made therein without departing from the true spirit and scope of the invention, which accordingly is intended to be defined solely by the appended claims.

What is claimed is:

1. A corrosion resistant electrical component comprising:
    an electrical component;
    a polysilicon coating encapsulating the electrical component; and
    a diamond-like carbon coating formed from a carbon source gas having a carbon to hydrogen ratio of between about 1:1 and 1:2 encapsulating the polysilicon coated electrical component.

2. The electrical component according to claim 1, in which the carbon source gas comprises a hydrocarbon gas.

3. The electrical component according to claim 2, in which the hydrocarbon gas is selected from a group consisting of acetylene, 1,3-butadiene, cyclohexane, benzene, styrene, xylene and mixtures thereof.

4. The electrical component according to claim 3, in which the hydrocarbon gas is 1,3-butadiene.

5. The electrical component according to claim 1, in which the gaseous mixture further comprises a diluent gas.

6. The electrical component according to claim 5, in which the diluent gas is an inert gas.

7. The electrical component according to claim 6, in which the inert gas is argon.

8. The component according to claim 5, in which the gaseous mixture comprises about 20% to 80% (v/v) carbon source gas.

9. The electrical component according to claim 1, in which the carbon to hydrogen atom ratio is about 1:1.5.

10. The electrical component according to claim 1, in which the component comprises a material selected from a group consisting of organic and inorganic substances and mixtures thereof.

11. The electrical component of claim 10, in which the inorganic substance is a metal.

12. The electrical component of claim 11, in which the metal is aluminum.

13. The electrical component of claim 10, in which the inorganic substance is a ceramic.

14. The electrical component of claim 10 in which the organic substance is a plastic.

15. A corrosion resistant electrical component comprising:
    an aluminum substrate;
    a polysilicon coating encapsulating the aluminum substrate; and
    a diamond-like carbon coating formed from a gaseous mixture comprising 1,3-butadiene and argon encapsulating the polysilicon coated aluminum substrate.

16. The electrical component according to claim 15, in which the gaseous mixture comprises about 20% to 80% (v/v) 1,3-butadiene.

17. A corrosion resistant electrical component encapsulated with polysilicon and diamond-like carbon coatings prepared by a process comprising the steps of:
    exposing an electrical component to a first atmosphere containing silicon ions to encapsulate the electrical component with a polysilicon film; and
    exposing the polysilicon encapsulated component to a second atmosphere containing carbon ions generated from a gaseous mixture comprising a carbon source gas having a carbon-hydrogen ratio of between about 1:1 and 1:2 to encapsulate the polysilicon encapsulated electrical component with a diamond-like carbon coating.

18. The electrical component of claim 17, in which the carbon source gas comprises a hydrocarbon gas.

19. The electrical component of claim 18, in which the hydrocarbon gas is selected from a group consisting of acetylene, 1,3-butadiene, cyclohexane, benzene, styrene, xylene and mixtures thereof.

20. The electrical component of claim 19, in which the hydrocarbon gas is 1,3-butadiene.

* * * * *